(12) United States Patent
Matsushita et al.

(10) Patent No.: US 7,015,628 B2
(45) Date of Patent: Mar. 21, 2006

(54) PIEZOELECTRIC SINGLE CRYSTAL DEVICE AND FABRICATION METHOD THEREOF

(75) Inventors: Mitsuyoshi Matsushita, Chiba (JP); Yousuke Iwasaki, Chiba (JP)

(73) Assignee: JFE Mineral Company, Ltd., Tokyo (JP)

( * ) Notice: Subject to any disclaimer, the term of this patent is extended or adjusted under 35 U.S.C. 154(b) by 10 days.

(21) Appl. No.: 10/846,681

(22) Filed: May 17, 2004

(65) Prior Publication Data

US 2004/0232803 A1    Nov. 25, 2004

(30) Foreign Application Priority Data

May 21, 2003   (JP)   ............................. 2003-143668

(51) Int. Cl.
  *H01L 41/04* (2006.01)
(52) U.S. Cl. ..................................... 310/358
(58) Field of Classification Search ............... 310/360, 310/358; 438/3; H01L 41/04
  See application file for complete search history.

(56) References Cited

U.S. PATENT DOCUMENTS

| | | | | |
|---|---|---|---|---|
| 5,804,907 A * | 9/1998 | Park et al. | .................... | 310/358 |
| 5,998,910 A * | 12/1999 | Park et al. | .................... | 310/358 |
| 6,756,238 B1 * | 6/2004 | Ogawa et al. | ................. | 438/3 |

* cited by examiner

*Primary Examiner*—Tom Dougherty
*Assistant Examiner*—Karen Addison
(74) *Attorney, Agent, or Firm*—Oliff & Berridge, PLC

(57) ABSTRACT le;2qA piezoelectric single crystal device for actively employing the electromechanical coupling factor $k_{31}$ in the direction orthogonal to the polarization direction is provided. Specifically, with the polarization direction as [001] axis of a pseudocubic system, an angle between the normal direction 1 of the piezoelectric device edge face and the direction n orthogonal to the domain structure within the crystal face including [010] and [100] axes orthogonal to the polarization direction is in the range 0 to 15° or 40 to 50°.

11 Claims, 9 Drawing Sheets

○ : OXYGEN ION  ● : M ION
⊘ : R ION

↔ EXTENDING DIRECTION OF STRIPPED LINES

↕ EXTENDING DIRECTION OF STRIPPED LINES

PIEZOELECTRIC SINGLE CRYSTAL DEVICE AND FABRICATION METHOD THEREOF

BACKGROUND OF THE INVENTION

1. Field of Invention

The present invention relates to a piezoelectric single crystal and a fabrication method thereof. More particularly, the invention relates to a piezoelectric single crystal formed of a piezoelectric single crystal material developed based on an electromechanical coupling factor $k_{31}$ in a direction orthogonal to the polarization direction.

2. Description of Related Art

For example, as shown in FIG. 1, with a rod-shaped piezoelectric single crystal device (L/a≧3, a=b) having an aspect ratio (L/a) of 3 or higher, of which the longitudinal direction is the polarization direction 3, the magnitude of vibration in the polarization direction 3 (the vertical vibration) at the time of applying a voltage along the polarization direction 3 is represented by an electromechanical coupling factor $k_{33}$ in a longitudinal vibration mode that is proportional to the square root of the conversion efficiency of the electric energy and the mechanical energy. The greater this value is, the more the efficiency improves. Also, as shown in FIG. 2A, with a plate-shaped piezoelectric single crystal device (a>>L, b>>L) having an aspect ratio (a/b) of 2.5 or higher, the greater the value of the electromechanical coupling factor $k_{31}$ in a direction 1 orthogonal to the polarization direction 3 (lateral vibration mode) is, the more the efficiency improves, as well.

It should be noted that, with a piezoelectric single crystal device, the electromechanical coupling factor of the device can be obtained in the same way with any wafer, such as, for instance, rectangular wafers, disc-shaped wafers, or the like, in addition to the above-described rod-shaped or plate-shaped wafer.

It should be noted that examples of the best known materials are piezoelectric single crystals comprised of a solid solution of lead zinc niobate $Pb(Zn_{1/3}Nb_{2/3})O_3$ and lead titanate $PbTiO_3$ (referred to as PZN-PT or PZNT), or a solid solution of lead magnesium niobate $Pb(Mg_{1/3}Nb_{2/3})O_3$ and lead titanate $PbTiO_3$ (referred to as PMN-PT or PMNT).

For example, Japanese Unexamined Patent Application Publication No. 6-38963 discloses an ultrasonic probe using a piezoelectric material comprised of a solid solution single crystal of lead zinc niobate-lead titanate (PZN-PT). This technique provides a probe with high sensitivity by using the single crystal of such a piezoelectric material which has an electromechanical coupling factor $k_{33}$ of 80 to 85% in a direction parallel to the polarization direction 3, i.e., a vibration mode of the vertical direction 3. Conventionally, while the electromechanical coupling factors $k_{33}$ in the direction parallel to the polarization direction 3 of the piezoelectric single crystals as described above have been studied and various usages have been developed, the properties in a direction orthogonal to the polarization direction 3 have not been studied yet.

It should be noted that the cases where piezoelectric devices have an electromechanical coupling factor $k_{31}$ greater than 80% in the direction 1 orthogonal to the polarization direction 3 (lateral vibration mode) are described in the documents Jpn.J.Appl.Phys.41 (2002) L55 and Jpn.J.Appl.Phys.41 (2002) pp. 7108 to 7112 written by Ogawa et al.

However, neither of these documents mention that there is a relationship between the electromechanical coupling factor $k_{31}$ in the direction 1 orthogonal to the polarization direction 3 (lateral vibration mode) and the domain structure, nor a repeatability exceeding 80%, and accordingly, this experimental data is assumed to have been accidentally obtained without repeatability, as in the case of other known documents.

The term "domain structure" generally means a striped pattern which can be observed on the surface of the device material with the naked eye or with a stereomicroscope as shown in FIGS. 7B, 7C, and 9B when a single crystal is cut out to a size suitable for a device. This striped pattern is a concentration pattern, and the intervals therein may be anywhere from several micrometers to about two hundred micrometers thick, and in some cases intervals of 1 mm or more are observed. Hereafter, in the present invention, "domain structure" should be understood to mean "the direction in which the stripes extend on the device surface", unless indicated otherwise.

SUMMARY OF THE INVENTION

Accordingly, it is an object of the present invention to provide a piezoelectric single crystal device wherein the orientation of such a domain structure (the direction in which the stripes extend on the device surface) is suitably controlled, and a fabrication method thereof.

To this end, according to a first aspect of the present invention, a piezoelectric single crystal device, with the polarization direction 3 as a [001] axis of a pseudocubic system, yields an excellent electromechanical coupling factor $k_{31}$ in the vibration mode of the lateral direction. The normal direction 1 of the piezoelectric device edge face is orthogonal to the polarization direction 3, the angle between the normal direction 1 of the piezoelectric device edge face and the direction n orthogonal to the domain structure within the crystal face including [010] and [100] axes orthogonal to the polarization direction 3, is within the range of 0 to 15° or 40 to 50°.

The piezoelectric single crystal device may comprise as the piezoelectric single crystal material thereof a solid solution comprising $x.Pb(A_1, A_2, \ldots, B_1, B_2, \ldots)O_3 + (1-x)PbTiO_3$, wherein x is a molar fraction and $0<x<1$, wherein $A_1, A_2, \ldots$ are one or a plurality of elements selected from a group composed of Zn, Mg, Ni, Lu, In and Sc, wherein $B_1, B_2, \ldots$ are one or a plurality of elements selected from a group composed of Nb, Ta, Mo and W. The material has a complex perovskite structure. The piezoelectric single crystal device may also further include 0.5 ppm to 5 percent by mass of one or a plurality of elements selected from a group of Mn, Cr, Sb, Ca, W, Al, La, Li and Ta A method of fabricating the piezoelectric single crystal device comprises: a step for cutting out a predetermined shape of a single crystal device material in a predetermined direction from a single crystal ingot having a domain structure; and a primary polarization step for applying an electric field to the [001] direction of the single crystal device material under predetermined conditions so as to polarize the single crystal device material.

The primary polarization step may be a step for applying a DC electric field of 350 to 1500 V/mm in a temperature range of 20 to 200° C. to the [001] direction of the cut out single crystal device material, or alternatively, the primary polarization step may be a step for applying a DC electric field of 350 to 500 V/mm in the [001] direction of the cut out single crystal device material at a temperature higher than the Curie temperature (Tc) of the single crystal device material, and cooling the temperature to room temperature while maintaining the application of the DC electric field.

The method may further comprise an auxiliary polarization step for applying an electric field in the direction orthogonal to the polarization direction so as to polarize the single crystal device material following or prior to the primary polarization step.

Thus, according to an exemplary embodiment of the present invention, a piezoelectric single crystal device can be fabricated for usage such as an actuator or transducer used for the position control of precision machines, which actively employs the electromechanical coupling factor $k_{31}$ of the direction orthogonal to the polarization direction (lateral vibration mode).

It should be noted that the term "pseudocubic system" here includes crystals that can be treated as cubic systems crystallographically, because of the coexistence of cubic systems, rhomboheral systems and tetragonal systems, wherein their 3 crystallographic axes are separated by an angle of about 90°±1°. Also, the term "perovskite structure" means a structure ($RMO_3$) wherein, with the unit lattice of a solid solution single crystal, as schematically shown in FIG. 3, R ions are positioned at the corners of the unit lattice, oxygen ions are positioned at the face-centered position of the unit lattice, and M ions are positioned at the body-centered position of the unit lattice. Moreover, "complex perovskite structure" according to the present invention means that M ions positioned at the body-centered position in FIG. 3 are made up of not a single type of element ion, but of two or more types of element ions ($A_1, A_2 \ldots, B_1, B_2$, and so forth).

BRIEF DESCRIPTION OF THE DRAWINGS

Various exemplary embodiments of this invention will be described in detail, with reference to the following figures, wherein.

DETAILED DESCRIPTION OF PREFERRED EMBODIMENTS

Although piezoelectric single crystals are adapted to various usages due to the electromechanical coupling factor $k_{33}$ in a direction parallel to the polarization direction 3 (longitudinal vibration mode) of the piezoelectric single crystal having a value equal to or greater than 80%, the electromechanical coupling factor $k_{31}$ in the direction 1 orthogonal to the polarization direction 3 (lateral vibration mode) is, for example, 49 to 62%, lower than the electromechanical coupling factor $k_{33}$ in the direction parallel to the polarization direction 3 (longitudinal vibration mode), as described in pp. 239 in IEEE Proc. MEDICAL IMAGING 3664 (1999) and other documents. Also, the value of the electromechanical coupling factor $k_{31}$ varies from one document to another.

The reason why, regardless of this piezoelectric single crystal device having a great electromechanical coupling factor $k_{33}$ in the polarization direction 3 (longitudinal vibration mode), the electromechanical coupling factor $k_{31}$ in the direction 1 (lateral vibration mode) orthogonal to the polarization direction 3 is small has been investigated. Also, why the value thereof has no repeatability and varies widely, to the extent that this piezoelectric single crystal device is inappropriate for a piezoelectric single crystal device using the lateral vibration mode has been investigated. The reason is that the domain structure (the direction in which the stripes extend on the device surface), formed of an electric dipole associated with the direction 1 orthogonal to the polarization direction 3 of the polarized piezoelectric single crystal device, does not have an appropriate direction as to the vibration direction 1 of lateral vibration.

In other words, the inventors discovered that a great electromechanical coupling factor $k_{31}$ in the direction 1 (lateral vibration mode) orthogonal to the polarization direction 3, with repeatability in the value thereof, a domain structure (the direction in which the stripes extend on the device surface), formed of an electric dipole associated with the direction 1 orthogonal to the polarization direction 3 of the polarized piezoelectric single crystal device, needs to have an appropriate direction as to the vibration direction 1 of lateral vibration.

The present invention will be described in detail below.

Figure 3:
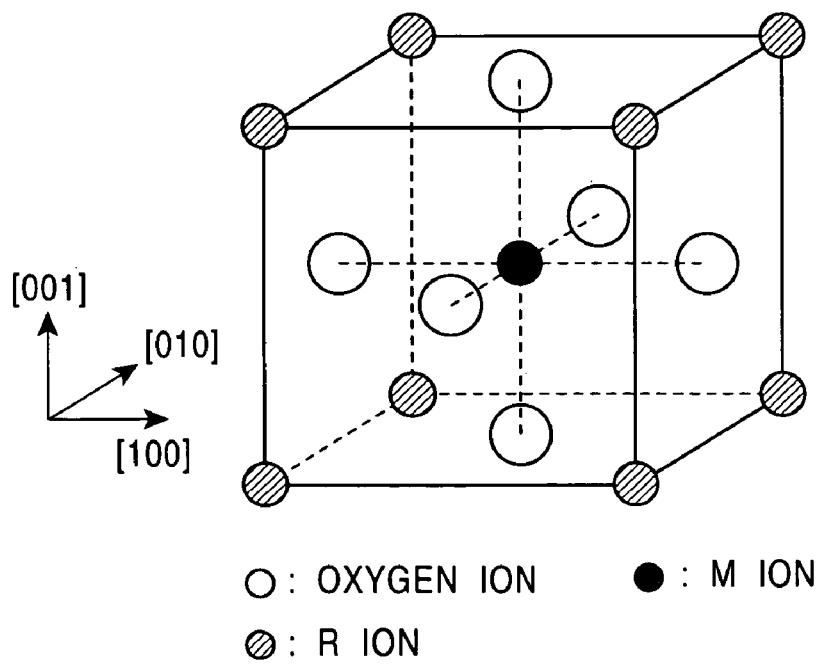
FIG. 3 is a schematic perspective view of the perovskite crystal structure ($RMO_3$)
Figure 4:
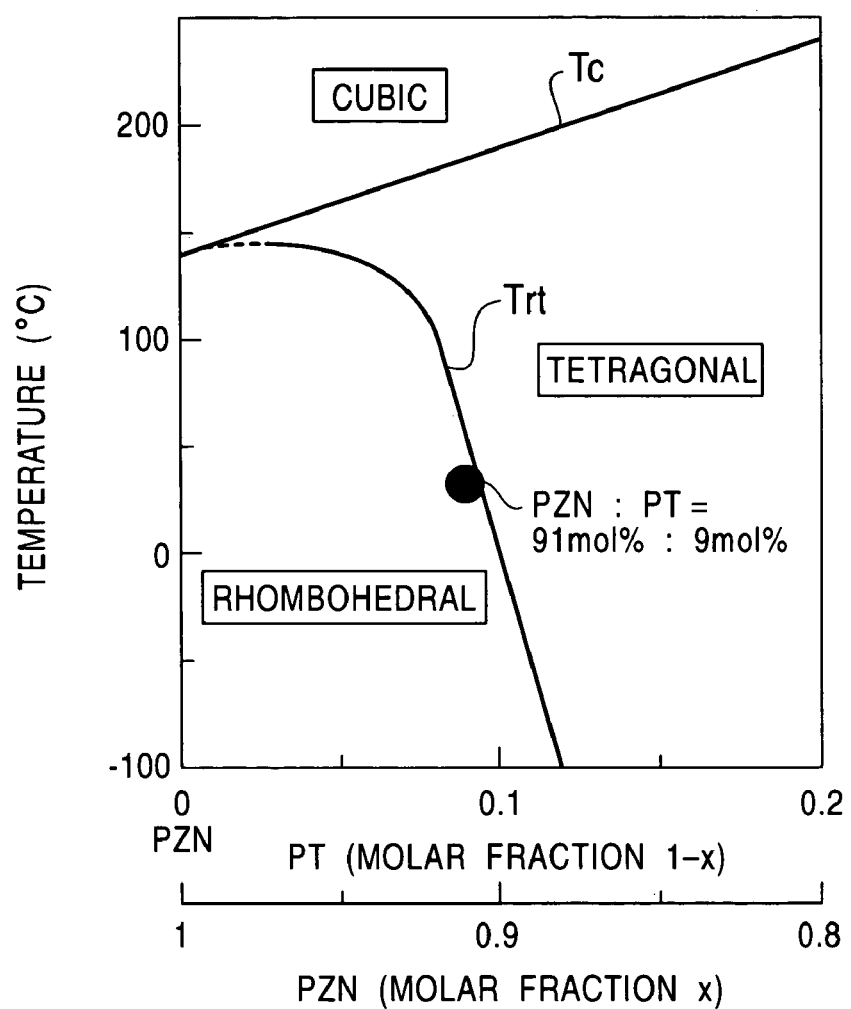
FIG. 4 is a phase diagram of PZN-PT (PZNT)

For example, the unit lattice of the solid solution single crystal of lead zinc niobate-lead titanate (referred to as "PZN-PT" or "PZNT") has a complex perovskite structure (Pb ions are positioned at the corners of the unit lattice, any element ion of Zn, Nb, and Ti is positioned at the body-centered position of the unit lattice) as shown, for example, in FIG. 3. FIG. 4 is a phase diagram illustrating a composition ratio of lead zinc niobate (PZN) and lead titanate (PT), extracted from Nomura et al., J.Phys. (1969), etc. The solid circle in FIG. 4 is an example of composition of a piezoelectric single crystal device (0.91 PZN–0.09 PT) containing 0.91 lead zinc niobate (PZN)+0.09 lead titanate (PT) (represented by molar fraction, x=0.91) used in the first through fourth embodiments. Note that in FIG. 4, Tc denotes the Curie temperature, and Trt denotes a phase transition temperature from a rhomboheral system (referred to as "pseudocubic system" in a broad concept) to a tetragonal system.

In particular, rhombohedral system PZN-PT such as 0.91 PZN–0.09 PT has a spontaneous polarization that is equivalent to an electric dipole in the eight directions of the orientation <111> of a crystal when viewed as a pseudocubic system.

Also, these spontaneous polarizations are not scattered through the crystal, but rather make up a structure (domain structure) comprising small regions (domains) continuously adjoined to each other. This structure exists as a pair of faces parallel to one of six {110} faces when a solid solution single crystal is viewed as a pseudocubic system. This situation can be observed as a striped pattern on the surface of a device material, as shown on the surface of a pseudocubic system in FIG. 5, with the naked eye or a stereomicroscope (see FIGS. 7B, 7C, and 9B), at the time of cutting out a single crystal into a size suitable for the device as described above. This striped pattern is a concentration pattern, and the intervals thereof may be anywhere from several micrometers to about two hundred micrometers, and in some cases intervals of 1 mm or more are observed.

Let us assume that [100], [010], [001] axes of the pseudocubic system of this single crystal are independent orthogonal axes, and this single crystal is cut out into a cube surrounded with six {100} faces. For example, FIG. 5 exhibits a predetermined direction, such as the direction where the stripes are parallel to the [010] axis on the (001), (00-1), (100), and (-100) faces, and the direction where the stripes are parallel to the [10-1] axis on the (010) and (0-10) faces.

That is to say, with such a cube, the direction in which the stripes extend on the device surface corresponding to the domain structure is parallel to the <100> axis (specifically, the [100], [010], and [001] axes) on four {100} faces (specifically, the (001), (00-1), (100), and (-100) faces), and is parallel to the <110> axis (specifically, the [10]-1and [101] axes) on the remaining two {100} faces (specifically, the (010) and (0-10) faces). That is to say, with each surface of the cube, each domain structure (the direction in which the stripes extend) is parallel or orthogonal to the <100> axial, or makes up an angle of 45° as to the <100> axial.

Even in the event that an electric field is applied in the <100> axial direction in such a spontaneous polarization state, the electric dipole rotates in the direction of the applied electric field (polarization direction 3, i.e., <100> axial orientation), so that the spontaneous polarization directions are aligned, regardless of the domain structure.

However, it has been found that the alignment assumes various states depending on the domain structure of the device material, the mode of application of the electric field, and the like. As a result, in the case of lead zinc niobate-lead titanate (PZN-PT) for example, although the electromechanical coupling factor $k_{33}$ in the direction parallel to the polarization direction 3 has a value equal to or greater than 80%, the electromechanical coupling factor $k_{31}$ in the direction 1 orthogonal to the polarization direction 3 is distributed with a variation of 49 to 62%, as described in the documents above (pp. 239 in EEEE Proc. MEDICAL IMAGING 3664 (1999)).

With such a value for the electromechanical coupling factor $k_{31}$ in the lateral vibration mode, it has been difficult to fabricate a piezoelectric single crystal device to be used as an actuator or as a transducer in application for position control of precision machines, which actively use this electromechanical coupling factor $k_{31}$.

The factors that would yield such results are explained as follows by taking into account the above-described domain structure. That is to say, with the piezoelectric single crystal cut out of the single crystal ingot after the grown state thereof, the domains comprised of a group of electric dipoles of the same direction face various directions in the direction parallel to the polarization direction 3 and the direction orthogonal to the polarization direction 3, and accordingly do not exhibit piezoelectric properties and are in an unpolarized state.

According to various exemplary embodiments, multiple domains cannot be aligned with the polarization direction 3 (one direction) unless an ordinary polarization temperature and applied voltage making up ordinary polarization conditions are selected, and an electric field is applied in the direction parallel to the polarization direction 3. Accordingly, the electromechanical coupling factor $k_{33}$ in the polarization direction 3 exhibits a value equal to or greater than 80% in the case of lead zinc niobate-lead titanate (PZN-PT), for example.

However, according to various exemplary embodiments, the alignment of the domains in the direction orthogonal to the polarization direction 3 can be controlled only under the polarization conditions in the direction parallel to the polarization direction 3, and by selecting an adequate domain structure within the face orthogonal to the polarization direction 3 of the cut out device material, and polarization conditions i.e., only within the adequate ranges of polarization temperature and applied voltage.

Description will now be made regarding the reasons for restricting the piezoelectric single crystal device according to various exemplary embodiments of the present invention.

(1) Crystal Structure of Piezoelectric Single Crystal Device (Complex Perovskite Structure of Pseudocubic System):

The concept of "Pseudocubic system", which the present invention deals with, includes crystals which can be treated as cubic systems crystallographically, because of the coexistence of cubic systems, rhomboheral systems and tetragonal systems, wherein their 3 crystallographic axes are separated by an angle of 90°±1°. Moreover, the unit lattice of a solid solution single crystal has a perovskite structure ($RMO_3$) wherein, as schematically shown in FIG. 3, Pb ions are positioned at the corners of the unit lattice, oxygen ions are positioned at the face-centered position of the unit lattice, and M ions are positioned at the body-centered position of the unit lattice. Furthermore, M ions positioned at the body-centered position in FIG. 3 have complex perovskite structures wherein M ions are made up of not a single type of element ion, but two or more types of element ions ($A_1, A_2 \ldots, B_1, B_2$, and so forth).

Figure 1:
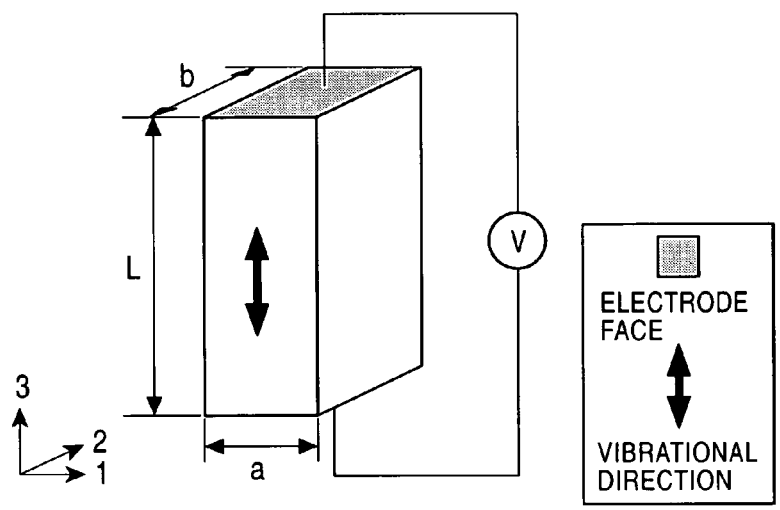
FIG. 1 is a diagram illustrating the orientation and shape of an example of a piezoelectric single crystal device using the electromechanical coupling factor $k_{33}$ in the longitudinal vibration mode.
Figure 2A:
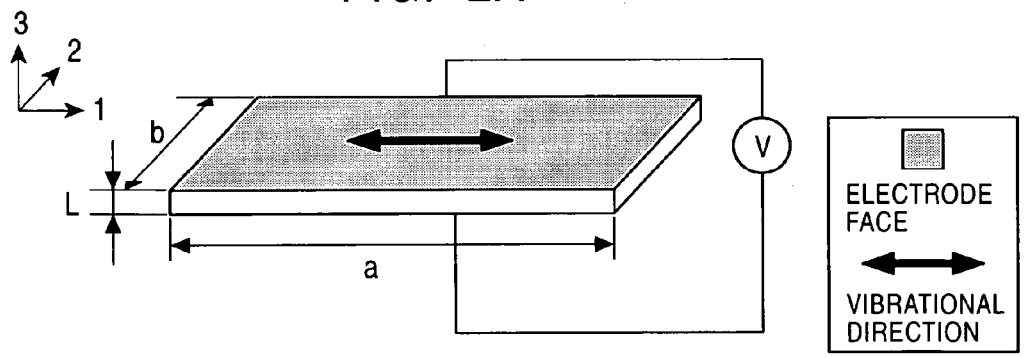
FIG. 2A is a diagram illustrating the orientation and shape of an example of a piezoelectric single crystal device using the electromechanical coupling factor $k_{31}$ in a direction 1 orthogonal to the polarization direction (lateral vibration mode)
Figure 2B:
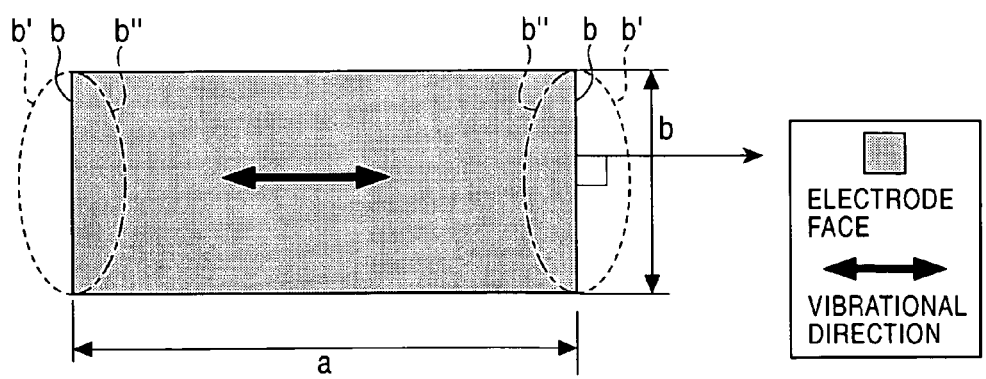
FIG. 2B is a diagram illustrating the edge face shape of an example of a piezoelectric single crystal device using the electromechanical coupling factor $k_{31}$ in a direction 1 orthogonal to the polarization direction (lateral vibration mode)

(2) Shape of the Single Crystal Device:

The shape of a piezoelectric single crystal device, which the present invention deals with, is preferably plate-shaped as shown in FIG. 2A, since employing the electromechanical coupling factor $k_{31}$ in the direction 1 orthogonal to the polarization direction 3 (lateral vibration mode) exhibits the most effective advantages. A more preferable shape of the device is a plate (a>>L, b>>L) having an aspect ratio (a/b) of about 2.5 or greater, and a more preferable shape is a plate having an aspect ratio (a/b) of about 3 or greater. It should be noted that the shape of both edge portions (short side b) of the plate-shaped device according to the present invention may be a convex curvature b' (dotted line) or concave curvature b" (single-dash broken line) depending on the usage thereof, as shown in FIG. 2B. Or, a square wafer wherein a=b may be employed. It should be noted that the term "device edge face" according to the present invention represents the short side b orthogonal to the long side a in FIG. 2B. Accordingly, the normal direction 1 of the device edge face (b) is parallel to the long side a of the device.

(3) The angle made up of the normal direction 1 of the piezoelectric device edge face and the direction n orthogonal to the domain structure within the crystal face including the [010] and [100] axes and orthogonal to the polarization direction 3, is within a range of 0 to 15°, or 40 to 50°:

The reason why the normal direction 1 of the device edge face using lateral vibration is restricted to such a range is thought to be as follows with angle ranges between more than 15° to less than 40° and between more than 50° to less than 90° other than the above-described angle ranges, there are low index crystal axes such as<310>, <210>, <320>, and the like between the <100> direction and the <110> direction within the face orthogonal to the polarization direction <100> axis, the lateral mode is scattered in these directions, and accordingly, a spurious phenomenon is generated in the impedance curve of the lateral vibration mode, and the frequency range of the lateral vibration mode (more precisely, the difference between resonant frequency $f_R$ and antiresonant frequency $f_A$) narrows. It is found that this is why the electromechanical coupling factor $k_{31}$ in the lateral vibration mode decreases.

Furthermore, from the viewpoint of the symmetric properties of a cubic system described in (4) below, the ranges 0° to −15° and −40° to −50° are also equivalent and are within range of the present application (4) Composition and Structure of the Single Crystal Device:

The composition of the piezoelectric single crystal device according to the present invention is a solid solution which is comprised of x·Pb($A_1, A_2, \ldots, B_1, B_2, \ldots$)$O_3$+(1−x)PbTiO$_3$ (Note that x is a molar fraction, wherein 0<x<1) where $A_1, A_2, \ldots$ are comprised of one or more elements selected from a group of Zn, Mg, Ni, Lu, In and Sc, and where $B_1, B_2, \ldots$ are comprised of one or more elements selected from a group of Nb, Ta, Mo and W, which make up a single crystal having a complex perovskite structure, thereby obtaining a single crystal appropriate for the lateral vibration mode. That is to say, the unit lattice of a solid solution single crystal needs to have a perovskite structure (RMO$_3$) wherein, as schematically shown in FIG. 3, Pb ions are positioned at the corners of the unit lattice, oxygen ions are positioned at the face-centered position of the unit lattice, and M ions are positioned at the body-centered position of the unit lattice. Furthermore, M ions positioned at the body-centered position in FIG. 3 need to have complex perovskite structures wherein M ions are made up of not a single type of element ions, but two or more types of element ions ($A_1, A_2 \ldots, B_1, B_2, \ldots$).

In particular, in the event that lead zinc niobate-lead titanate (PZN-PT) is employed as a solid solution single crystal, the above-described molar fraction x is preferably set in a range between 0.80 and 0.98, and more preferably in a range between 0.89 and 0.95. Also, when lead magnesium niobate-lead titanate (PIMN-PT) is employed as a solid solution single crystal, the above-described molar fraction x is preferably set in the range 0.60 to 0.98, more preferably in the range 0.60 to 0.80. Moreover, when lead indium magnesium niobate titanate (PIMN-PT) is employed as a solid solution single crystal, the above-described molar fraction x is preferably set in the range 0.60 to 0.80, more preferably in the range 0.64 to 0.76.

Moreover, in the event that there is a need to increase specific inductive capacity ∈r and a mechanical quality factor Qm, an arrangement may be made wherein 0.5 ppm to 5 percent by mass of one or multiple elements selected from a group of Mn, Cr, Sb, Ca, W, Al, La, Li and Ta is further added to the above-described composition of a piezoelectric single crystal device. However, addition of more than 5 percent by mass makes forming single crystals difficult, and polycrystalization may occur. The advantages of the addition of these elements are, for example, that the addition of Mn and Cr improves the mechanical quality factor Qm and prevents deterioration over time. Also, the addition of Sb, La, W, and Ta improves the specific inductive capacity ∈r.

Next, description will be made regarding an appropriate fabrication method for a piezoelectric single crystal device according to various exemplary embodiments of the present invention.

The fabrication method for a piezoelectric single crystal device according to various exemplary embodiments of the present invention includes a step of fabricating single crystal ingots including a domain structure, a step of cutting out a predetermined-shaped single crystal device material in a predetermined direction from the single crystal ingot, a primary polarization step of applying an electric field in the [001] direction of this single crystal device material so as to polarize the single crystal device material, and an auxiliary polarization step prior to the primary polarization step or following the primary polarization step as necessary.

Description will be made regarding the reasons for restricting the fabrication method according to various exemplary embodiments of the present invention in each step as follows.

(5) Fabrication of Single Crystal Ingot Having Domain Structure:

Examples of the fabrication method for a single crystal ingot comprising a solid solution which is comprised of x.Pb($A_1, A_2, \ldots, B_1, B_2, \ldots$)$O_3$+(1−x)PbTiO$_3$ (x is a molar fraction, wherein 0<x<1) where $A_1, A_2, \ldots$ are one or a plurality of elements selected from a group composed of Zn, Mg, Ni, Lu, In and Sc and $B_1, B_2, \ldots$ are one or a plurality of elements selected from a group composed of Nb, Ta, Mo and W, or a single crystal ingot wherein 0.5 ppm to 5 percent by mass of one or multiple elements selected from a group of Mn, Cr, Sb, Ca, W, Al, La, Li and Ta is further added to the above-described solid solution. The fabrication method includes dissolving a material which is prepared with the above-described composition in flux, and then lowering the temperature so as to coagulate the material. The fabrication method also includes heating a material which is prepared with the above-described composition to above the melting point so as to be melted, and then coagulated in one direction. Examples of the former method include the flux method, the Bridgeman Technique, the TSSG (Top Seeded Solution Growth) method, and so forth, and examples of the latter method include the horizontal melting Bridgeman Technique, the CZ method (Czochralski Method), and so forth, but the fabrication method according to the present invention is not restricted to any particular method.

(6) Determination of Crystallographical Orientation of Single Crystal Ingot:

The [001] axial orientation of a single crystal ingot is generally determined using the Laue method, and at the same time, crystallographical orientations are generally determined, such as the [010] axial orientation and the [100] axial orientation orthogonal to the [001] axial orientation, or as necessary the [110], [101], [011] axial orientation, and so forth.

Furthermore, the crystallographic face of the {100} face orthogonal to any one crystal axis of the [001], [010], [100] axes, and so forth is grinded, and precise orientation is determined using an X-ray direction finder, or the like, so as to correct the offset of the above grinded face.

(7) Rough Cutting (Cutting for Obtaining a Wafer with Appropriate Thickness):

A single crystal ingot parallel to or orthogonal to the grinded {100} face of the above single crystal ingot is cut using cutting instruments such as a wire saw, an inner diamond saw, and so forth so as to obtain a wafer with appropriate thickness. It should be noted that a step for performing chemical etching using an etching solution may be included as necessary following cutting.

(8) Grinding (Grinding for Obtaining a Wafer with Predetermined Thickness):

The above wafer is grinded using a grinding machine such as a lapping machine, a polishing machine, and the like, so as to obtain a wafer with the desired thickness. It should be noted that a step of chemical etching using an etching solution may be included as necessary following grinding.

Figure 5:
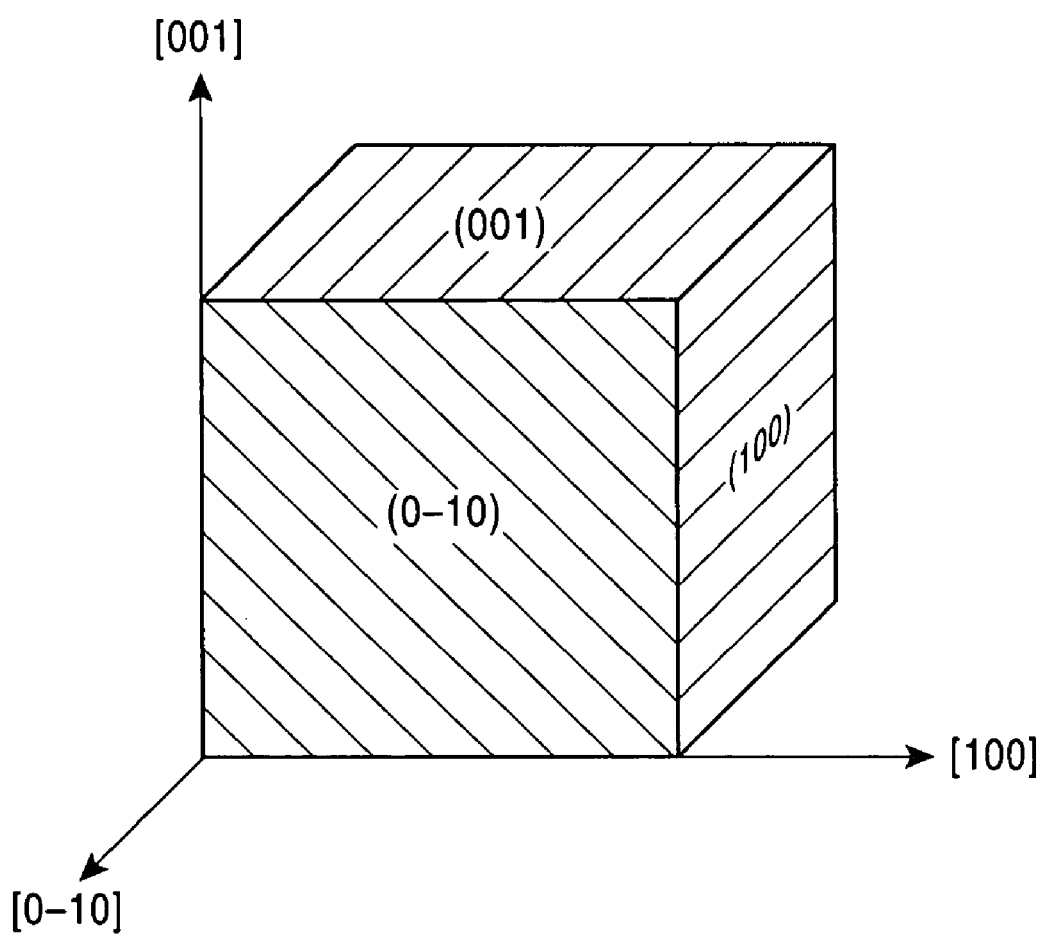
FIG. 5 is a schematic view of the domain structure on the surface of a cube, the faces of which are {100} faces.

(9) Fabrication of Single Crystal Device Material:

The above wafer has the {100} face as a wafer face (the widest face). This wafer domain structure (the direction in which the stripes extend) is parallel to or orthogonal to the [100] axial orientation, or makes up an angle of 45° as to the [100] axial orientation, as shown in FIG. 5. A single crystal device material of a predetermined shape is cut out from this wafer using precision cutting instruments such as a dicing saw, a cutting saw, and the like, such that an angle made up of the normal direction 1 of the device edge face and the direction n orthogonal to the domain structure (the direction in which the stripes extend) within the {100} face becomes 0 to 15° or 40 to 50°, thereby fabricating the single crystal device material.

(10) Fabrication of Electrodes:

It is necessary to fabricate electrodes for applying an electric field in the primary polarization processing, or further the auxiliary polarization processing, beforehand.

On the opposed upper and lower faces on the {100} face of the fabricated single crystal device material, a Cr—Au coating film (the first layer formed of a Cr layer with thickness of around 50 Å and the second layer formed of an Au layer with thickness of around 100 to 200 Å) is formed by sputtering, a gold coating film is formed by plasma vapor deposition, or a silver coating film is formed by screen printing, then the silver coating film is baked so as to fabricate an electrode prior to the primary polarization processing.

An electrode is similarly formed on the opposing two faces perpendicular to the auxiliary polarization direction, prior to the auxiliary polarization processing.

It should be noted that in the event of performing the primary polarization processing following the auxiliary polarization processing, or in the event of performing the auxiliary polarization processing following the primary polarization processing, it is necessary to completely remove residual electrodes using adequate chemical etching solutions and acid, since residual electrodes used in the first polarization processing may destabilize the subsequent polarization processing.

(11) Primary Polarization Processing Step:

With the piezoelectric single crystal cut out of the single crystal ingot after the single crystal has been grown, the domains comprised of a group of electric dipoles of the same direction face various directions in the direction parallel to the polarization direction 3 and the direction orthogonal to the polarization direction 3, and accordingly do not exhibit piezoelectric properties and are in an unpolarized state.

Multiple domains cannot be aligned with the polarization direction 3 (one direction) unless an ordinary polarization temperature and applied voltage making up ordinary polarization conditions are selected and an electric field is applied in the direction of the polarization direction 3. Accordingly, the electromechanical coupling factor $k_{33}$ in the polarization direction 3 exhibits a large value equal to or greater than 80% in the case of lead zinc niobate-lead titanate, for example.

However, the alignment of the domains in the direction orthogonal to the polarization direction 3 cannot be controlled with the above-described polarization processing, and can only be controlled under the polarization conditions in the direction parallel to the polarization direction 3, and by selecting the adequate domain structure within the face orthogonal to the polarization direction 3 of the cut out device material and polarization conditions, i.e., only within adequate ranges of the polarization temperature, applied voltage, and polarization processing time.

With the primary polarization step according to the present invention, a DC electric field of 350 to 1500 V/mm is preferably applied to the polarization direction 3 of the cut out single crystal device material in a temperature range of 20 to 200° C. That is to say, in the event that the temperature is below the lower limit of 20° C. of the above preferable temperature range, or if the electric field is below the lower limit of 350 V/mm of the above applied electric field range, polarization will be insufficient. Moreover, if the temperature is above the upper limit of 200° C. of the above preferable temperature range, or if the electric field is above the upper limit of 1500 V/mm of the above applied electric field range, overpolarization occurs, which deteriorates the piezoelectric properties of the piezoelectric single crystal device. Furthermore, distortion within the crystal may increase due to a high electric field, leading to possible breaking, and causing cracks on the piezoelectric single crystal device.

The polarization time is preferably adjusted according to polarization temperature and applied voltage selected from the above preferable range. The maximum polarization time is 180 minutes.

Alternatively, it is preferable to lower the temperature to room temperature while applying a DC electric field of 250 to 500 V/mm in the polarization direction 3 of the cut out single crystal device material at a temperature higher than the Curie temperature (Tc) of the single crystal device material, preferably 180 to 300° C. Raising the temperature beyond the Curie temperature (Tc) temporarily eliminates electric dipoles, following which lowering the temperature to below the Curie temperature aligns the orientations of the electric dipoles more uniformly. In the event of a temperature below the Curie temperature, part of the electric dipoles remain, thereby causing insufficient polarization. Polarization is also insufficient when the electric field is below the lower limit of 250 V/mm of the above preferable applied electric field range. On the other hand, if electric field exceeds the upper limit value 500 V/mm of the above preferable applied electric field range, overpolarization occurs, thereby deteriorating the piezoelectric properties of the piezoelectric single crystal device. Furthermore, distortion within the crystal increases due to a high electric field, leading to possible breaking, and causing cracks on the piezoelectric single crystal device. It should be noted that the cooling speed is preferably a cooling speed wherein cracks do not occur in the device during cooling.

Note that the Curie temperature is a transition temperature above which a material exhibits neither piezoelectric properties nor ferroelectric properties since the temperature above the Curie temperature causes electric dipoles to face random directions and to not be aligned. The Curie temperature of a material is determined by the composition and/or structure of the material.

(12) Auxiliary Polarization Processing Step:

While the above-described primary polarization processing step is a step of performing primary polarization of the piezoelectric single crystal device, the auxiliary polarization processing step is a step of applying an electric field in the direction orthogonal to the above-described polarization direction 3, preferably in the lateral vibration direction 1 so as to control the alignment state of the ferroelectric domain orthogonal to the above-described polarization direction 3.

Types of electric field to be applied to the direction orthogonal to the above-described polarization direction 3 include attenuation electric fields, steady-state electric fields such as DC electric fields, pulse electric fields, alternating current electric fields, and the like, each of which have satisfactory conditions regarding electric field strength, application time, temperature conditions, and the like, depending on the properties of each piezoelectric single crystal device and the desired electromechanical coupling factor $k_{31}$ in the direction orthogonal to the polarization direction, which are determined by experimentation and the like. In order to obtain the advantage of the auxiliary polarization processing, auxiliary polarization processing temperature is preferably 25° C. to a phase transition temperature (for example, the Trt line shown in FIG. 4), and the applied electric field range is preferably 350 to 1500 V/mm. It should be noted that polarization time is preferably adjusted depending on a polarization processing temperature and applied electric field selected from the above-described preferable ranges, in particular, preferably 10 minutes to two hours.

Figure 10:
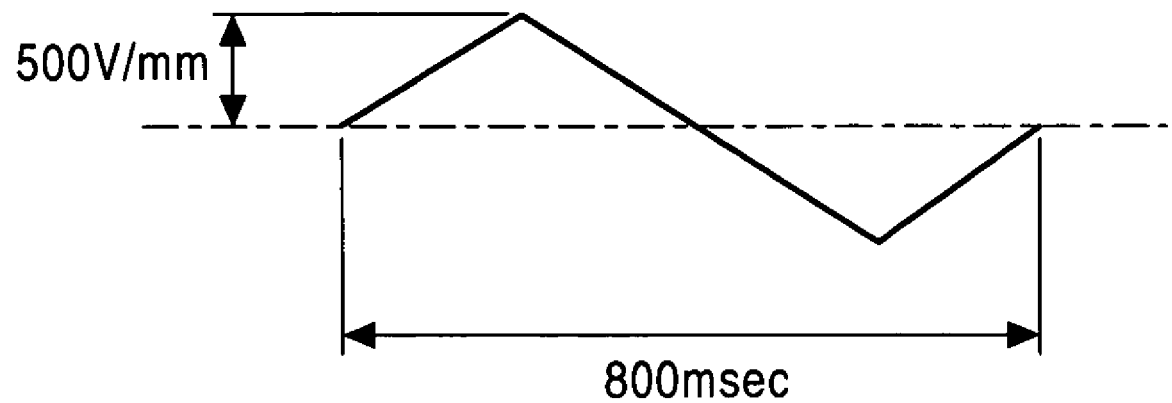
FIG. 10 is a waveform diagram of a bipolar triangular pulse.

Also, examples of the above-described pulse electric field include unipolar and bipolar pulses, such as alternating triangular waves and the like, as shown in FIG. 10, in addition to orthogonal waves.

Embodiments

Selection of domain structures (parallel concentration stripes on the crystal face) and a method for controlling polarization conditions, which are required for obtaining a piezoelectric single crystal device having a great electromechanical coupling factor $k_{31}$ suitable for a piezoelectric single crystal device using the direction orthogonal to the polarization direction (lateral vibration mode), will now be described in the following embodiments.

First Embodiment

Figure 6A:
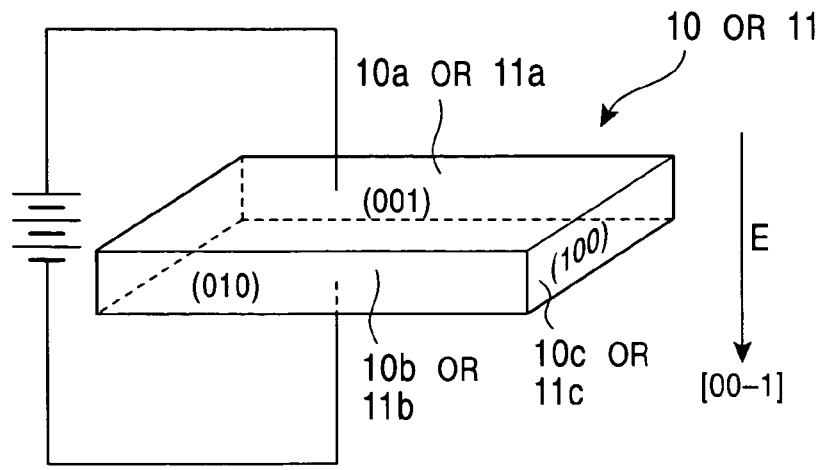
FIG. 6A is a diagram illustrating the case of applying a DC electric field to a single crystal.

FIG. 6A illustrates the shape of a piezoelectric single crystal device (Curie temperature Tc of 175° C., device dimensions of 13 mm in length, 4 mm in width, and 0.36 mm in thickness) of 0.91 lead zinc niobate (PZN)+0.09 lead titanate (PT) (represented by molar fraction, x=0.91) used in the first embodiment.

It should be noted that fabrication of the piezoelectric single crystal device is performed in accordance with the above-described fabrication method, i.e., a preparation is performed so as to obtain a composition of 0.91 lead zinc niobate (PZN)+0.09 lead titanate (PT)(represented by molar fraction, x=0.91), and then a single crystal ingot is obtained using the aforementioned Bridgeman Technique. Next, the precise crystallographical orientation of this single crystal ingot is determined, the single crystal ingot is grinded, and then the single crystal ingot is cut orthogonal to the grinded face {100} with a wire saw so as to obtain a wafer 0.5 mm in thickness. A wafer 0.36 mm in thickness is obtained by grinding this wafer using a grinding machine. A single crystal device material 13 mm in length, 4 mm in width, and 0.36 mm in thickness, is then cut out from this wafer using a dicing saw.

With single crystal device materials 10 and 11 of which the fabricated six faces are surrounded by the {100} face, it is assumed that the polarization direction is the [00-1] axial direction (vertical direction in FIG. 6A) between an upper face 10a or 11a and a lower face 10b or 11b.

Figure 6B:
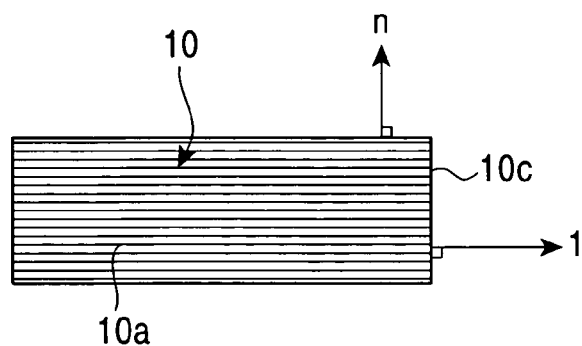
FIG. 6B is a diagram illustrating an angle of 90° made up of a normal direction 1 of an edge face 10c of a single crystal device material 10 and a direction n orthogonal to the domain structure.
Figure 6C:
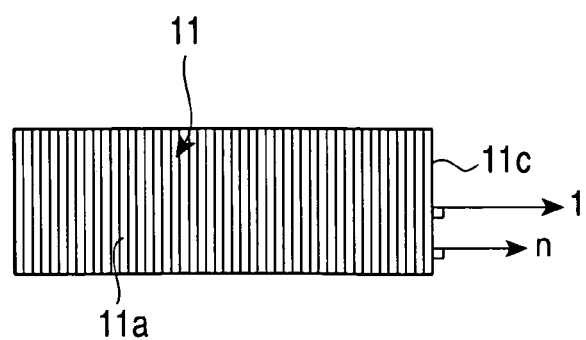
FIG. 6C is a diagram illustrating an angle of 0° made up of a normal direction 1 of an edge face 11c of a single crystal device material 11 and a direction n orthogonal to the domain structure.
Figure 7A:
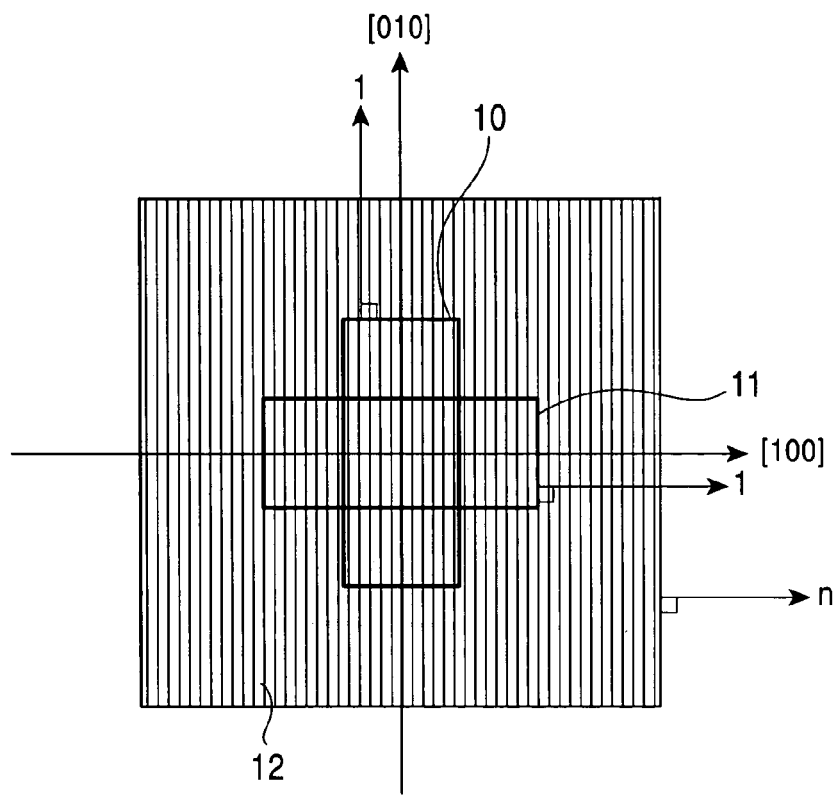
FIG. 7A is a relational diagram between the single crystal device materials 10 and 11 of which (001) face (the face facing the viewer in the drawing) is a face orthogonal to a polarization direction 3, and the domain structure thereof.
Figure 7B:
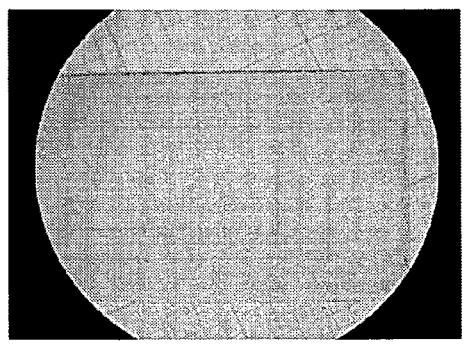
FIG. 7B is a surface photograph illustrating the domain structure of the single crystal device material 10 (the grid pitch of the background grid is 1 mm)
Figure 7C:
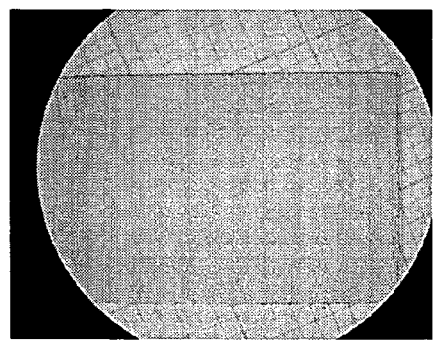
FIG. 7C is a surface photograph illustrating the domain structure of the single crystal device material 11 (the grid pitch of the background grid is 1 mm)

It should be noted that the single crystal device material 10 is cut out from a large-sized single crystal wafer 12 shown in FIG. 7A using a dicing saw, such that a direction n orthogonal to the domain structure of the upper face 10a thereof (the direction in which the stripes extend on the device surface) is orthogonal to the normal line 1 of a device edge face 10c (see FIG. 6B and FIG. 7B), and the single crystal device material 11 is cut out from a large-sized single crystal wafer 12 shown in FIG. 7A using a dicing saw such that a direction n orthogonal to the domain structure of the upper face 11a thereof (the direction in which the stripes extend on the device surface) is parallel to the normal line 1 of a device edge face 11c (see FIGS. 6C and 7C).

On the opposing upper and lower faces 10a and 10b or 11a and 11b on the {100} face of the respective fabricated single crystal device materials 10 and 11, a Cr—Au coating film (the first layer formed of a Cr layer with thickness of around 50 Å and the second layer formed of an Au layer with a thickness of around 100 to 200 Å) is formed by sputtering so as to fabricate a gold electrode, and a DC electric field of 700 V/mm is applied to the gold electrode in an atmosphere of 25° C. for 60 minutes so as to polarize the electrode, thereby the fabricating piezoelectric single crystal devices 10' and 11'.

Figure 8A:
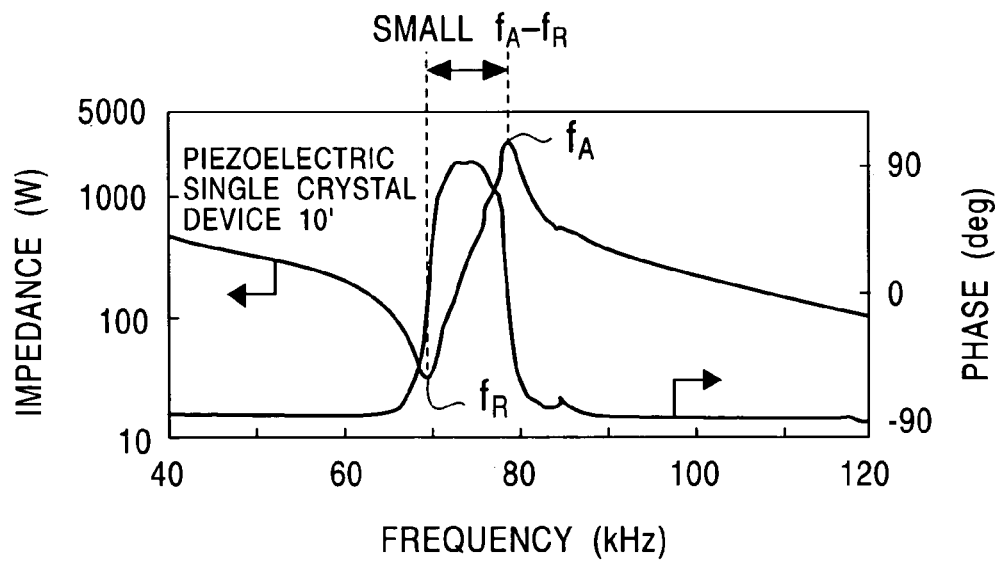
FIG. 8A is a diagram illustrating an impedance curve and phase in $k_{31}$ vibration mode in the case of a piezoelectric single crystal device 10'.
Figure 8B:
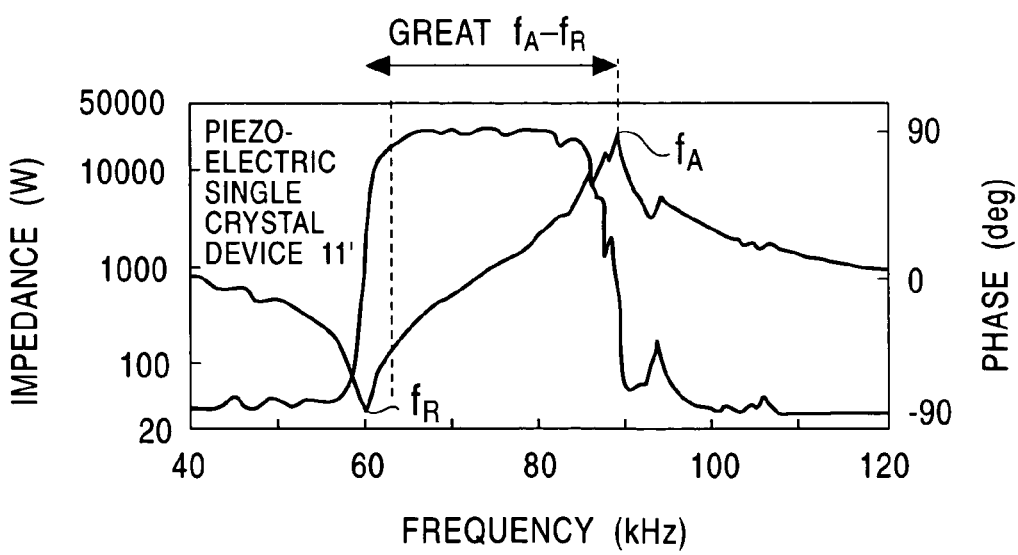
FIG. 8B is a diagram illustrating an impedance curve and phase in $k_{31}$ vibration mode in the case of a piezoelectric single crystal device 11'.

FIGS. 8A and 8B illustrate impedance curves and phases in the $k_{31}$ mode obtained by an impedance phase analyzer (manufactured by Hewlett-Packard Company, model No. HP4912) with regard to the two fabricated piezoelectric single crystal devices 10' and 11' following polarization processing. FIGS. 8A and 8B show two frequencies when the phase is 0°, i.e., FIGS. 8A and 8B show that the greater the difference between the resonant frequency $f_R$ and the antiresonant frequency $f_A$, the greater the electromechanical coupling factor $k_{31}$. $k_{31}$ is calculated in accordance with the known arithmetic expression (see the Electronic Material Industrial Standard: EMAS-6008, 6100). The measured results are shown in Table 1.

With the piezoelectric single crystal device 10' shown in FIG. 8A (an angle made up of the direction n orthogonal to the domain structure (the direction in which the stripes extend on the device surface) of the upper face 10a thereof and the normal direction 1 of the device edge face 10c is 90°), the electromechanical coupling factor $k_{31}$ in the direction orthogonal to the polarization direction (lateral vibration mode) exhibits 50.7%, i.e., 55% or less, which corresponds to insufficient properties as a device for the lateral vibration mode (FIG. 8A).

On the other hand, with the piezoelectric single crystal device 11' shown in FIG. 8B (an angle made up of the direction n orthogonal to the domain structure, which is the direction in which the stripes extend on the device surface, of the upper face 11a thereof and the normal direction 1 of the device edge face 11c is 0°), the electromechanical coupling factor $k_{31}$ in the direction orthogonal to the polarization direction (lateral vibration mode) exhibited 86.2%, i.e., 80% or more, which corresponds to sufficient properties as a device for the lateral vibration mode (FIG. 8B).

Also, with a composition of the solid solution of 0.91 lead zinc niobate (PZN)+0.09 lead titanate (PT) (represented by molar fraction, x=0.91) further including 0.5 ppm to 5 percent by mass of one or several elements selected from a group composed of Mn, Cr, Sb, Ca, W, Al, La, Li and Ta, a device was fabricated according to the same fabrication method as that of the 0.91 PZN–0.09 PT, and the electromechanical coupling factor $k_{31}$ of the device was studied under the same testing conditions as that of the 0.91 PZN–0.09 PT.

As a result, as shown in Table 1, when an angle made up of the direction n orthogonal to the piezoelectric single crystal device 11' (the domain structure, which is the direction in which the stripes extend on the device surface, of the upper face 11a thereof) and the normal direction 1 of the device edge face 11c is 0°, a high electromechanical coupling factor $k_{31}$ is obtained. In particular, when adding Mn or Cr to the solid solution, the mechanical quality factor Qm markedly improves from 65.0 to about 120.0 to 150.0, and further, when adding Sb, W, La, and Ta to the solid solution, the specific inductive capacity εr drastically improves from 3500 to about 4300 to 4700. The mechanical factor Qm and specific inductive capacity εr are obtained in accordance with the Electronic Material Industrial Standard (see the Electronic Material Industrial Standard EMAS-6008, 6100) using a impedance analyzer (manufactured by Hewlett-Packard Company, model No. HP4192A).

Second Embodiment

Figure 9A:
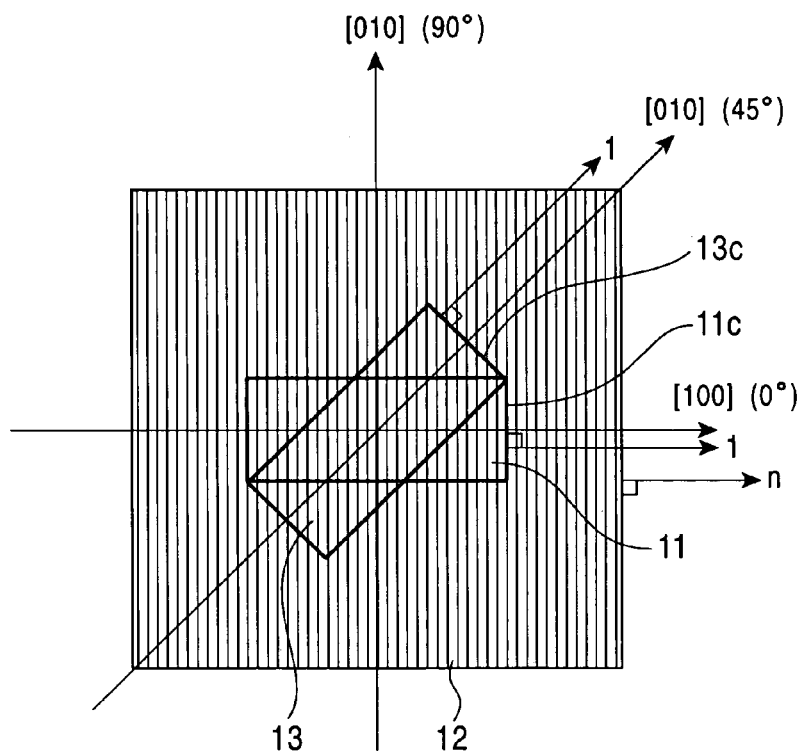
FIG. 9A is a diagram illustrating the direction for cutting out various single crystal device materials from a single crystal wafer 12 in a range of 0 to 90° made up of a direction n orthogonal to the domain structure and the normal direction 1 of device edge faces 11C and 13C.

As shown in FIG. 9A, the angle made up of the normal direction 1 of the edge face 11c of the device using the lateral mode and the direction n orthogonal to the domain structure (the direction in which the stripes extend on the surface) is changed, from 0° (the [100] direction shown in FIG. 9A) to 90° (the [010] direction shown in FIG. 9A) in increments of 5° in order to study the correlation between the domain structure and the edge face direction 1 of the device using the lateral vibration mode (specifically, the normal direction of the edge face), fabricated cut out single crystal device materials 11 and 13 and so forth using a dicing saw, which were polarized in the direction orthogonal to the face facing the viewer in the drawing in FIG. 9A. The single crystal materials are polarized using the polarization method of applying a DC electric field of 700 V/mm in an atmosphere of 25° C. for 60 minutes so as to obtain piezoelectric single crystal devices 11' and 13', and then measure the electromechanical coupling factor $k_{31}$ regarding the lateral vibration mode thereof. The measured results are shown in Table 2. The fabrication method for the piezoelectric single crystal device, the device dimension, and the testing conditions are employed in the same way as in the first embodiment.

The reason why the angle range of 0° to 90° as to the [100] axial direction within the face orthogonal to the polarization direction (the face facing the viewer in the drawing in FIG. 9, and more strictly, within the crystal face including the axes [010] and [100] orthogonal to the polarization direction 3) is selected is because the angle range of 0° to 90° is a necessary and sufficient angle range to obtain information regarding all directions within the {100} face orthogonal to the polarization direction, due to the symmetric properties of a cubic system.

Figure 9B:
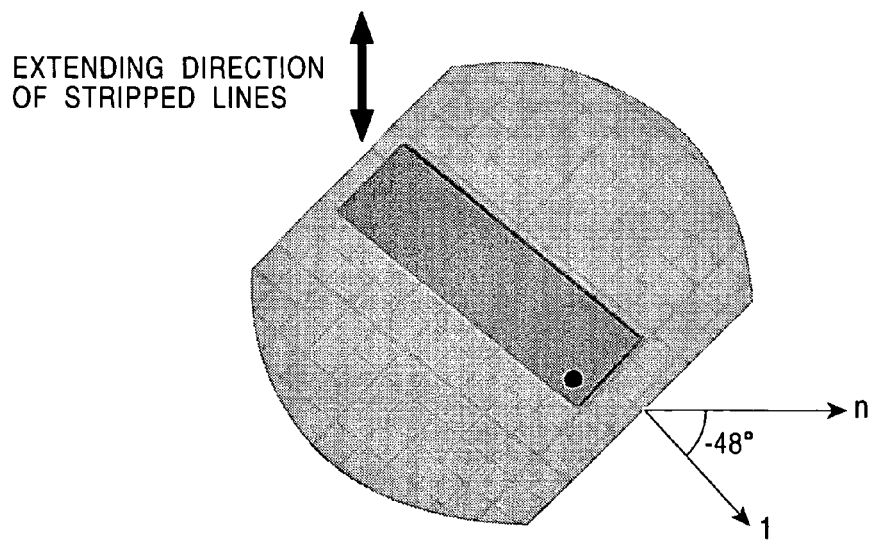
FIG. 9B is a surface photograph of a single crystal device cut out so as to make up an angle of −48° between a direction n orthogonal to the domain structure and the normal direction 1 of device edge faces (the grid pitch of the background grid is 1 mm)

As can be understood from the results shown in Table 2, with 0° to 15° and 40° to 50° as to the axial [100] with the face orthogonal to the polarization direction 3, 0.91 lead zinc niobate (PZN)+0.09 lead titanate (PT), i.e., the electromechanical coupling factor $k_{31}$ regarding the lateral vibration mode exhibits 70% or more, thereby yielding a device suitable for the lateral usage. FIG. 9B is a surface photograph of the cut out single crystal device using a dicing saw such that the normal direction 1 of the device edge face as to the direction n orthogonal to the domain structure is −48°.

Furthermore, with an angle range of 0 to 15° and an angle range of 40 to 50°, measuring the $k_{31}$ in detail in angle increments of 5°, it was confirmed that the electromechanical coupling factor $k_{31}$ of the lateral vibration mode consistently exhibits 70% or more.

Also, with regard to two cases where the molar fraction x of the lead zinc niobate (PZN) of x lead zinc niobate (PZN)+(1−x) lead titanate (PT)(PZN-PT) is 0.80 and 0.95 (0.80 PIMN-0.20 PT and 0.95 PZN-0.05 PT) and with regard to materials other than lead zinc niobate, i.e., lead magnesium niobate (PIMN)+lead titanate (PT)(PIMN-PT), and lead indium magnesium niobate (PIMN)+lead titanate (PT)(PIMN-PT), the devices were fabricated with the same fabrication method as that of 0.91 PZN-0.09 PT, and the electromechanical coupling factor $k_{31}$ studied under the same testing conditions as with 0.91 PZN-0.09 PT. As a result, great electromechanical coupling factors $k_{31}$ were obtained in each material in an angle range 0 to 50° and an angle range 40 to 50°, as shown in Table 2. Note that with 0.70 PMN-0.30 PT, the molar fraction x of lead magnesium niobate (PMN) is 0.70, and with 0.70 PIMN-0.30 PT, the molar fraction x of lead indium magnesium niobate (PIMN) is 0.70.

On the other hand, with appropriate angle ranges of 0° to 15° and of 40° to 50° as to the [100] axial direction with the face orthogonal to the polarization direction 3, there is no low-index crystal axis orientation such as the above-described <310>, <210>, <320>, and the like, which generate the lateral vibration mode in a dispersed manner, and thus, obtaining a great electromechanical coupling factor $k_{31}$ of the lateral vibration mode can be expected. Also, with an angle range of 75° to 90°, correlation between the domain structure and the normal direction of the device edge face using the lateral vibration becomes an angle range of 0° to 15°, which is an inverse correlation, and accordingly, it is assumed that this will result in only a small lateral vibration mode electromechanical coupling factor $k_{31}$.

Third Embodiment

A preferred polarization processing method for fabricating a suitable piezoelectric single crystal device using the lateral vibration mode will be described for a third embodiment. The measured results for the electromechanical coupling factor $k_{31}$ of the lateral vibration mode of the piezoelectric single crystal devices 10' and 11' fabricated under the various polarization processing conditions are shown in Table 3. The fabrication method for the piezoelectric single crystal device, the device dimensions, and the testing conditions are similar to those in the first embodiment. Also, as for the composition of the piezoelectric single crystal device, a device with the same composition as in the second embodiment is employed. The measured results are shown in Table 3.

In the case where the polarization processing temperature of the crystal 11 suitable for the lateral mode fabricated with the same method as the one described in the first embodiment is 25° C., the applied electric field was 320 V/mm below the lower limit value of the range according to the present invention, and several application periods are selected from about 30 to 180 minutes, as, for example, shown in the case of the longest application period of 180 minutes of Comparative Example (1) in Table 3, with 0.91 lead zinc niobate (PZN)+0.09 lead titanate (PT), the electromechanical coupling factor $k_{31}$ in the direction orthogonal to the polarization direction (lateral vibration mode) exhibits 58%, i.e., 60% or less, which yields insufficient properties as a device for the lateral vibration mode. With an application period shorter than 180 minutes, the electromechanical coupling factor $k_{31}$ obtained is even lower. It is assumed that a sufficient polarization cannot be obtained under the above-described conditions.

On the other hand, with the crystal 10 inappropriate for the lateral mode use and fabricated in the same way as in the first embodiment, the electromechanical coupling factor $k_{31}$ in the direction orthogonal to the polarization direction (lateral vibration mode) exhibited 55% or less with 0.91 lead zinc niobate (PZN)+0.09 lead titanate (PT), and improvement could not be obtained under these polarization processing conditions.

Also, when the polarization processing temperature of the crystal 11 suitable for the lateral mode fabricated in the same method as in the first embodiment is 40° C., the applied electric field is 1700 V/mm above the upper limit value of the range according to the present invention, and several application periods were selected from 30 to 180 minutes, as shown, for example, in the case of the shortest application period of 30 minutes in Comparative Example (9) in Table 3, with 0.91 lead zinc niobate (PZN)+0.09 lead titanate (PT), the resulting electromechanical coupling factor $k_{31}$ in the direction orthogonal to the polarization direction (lateral vibration mode) is 53%. In addition, when the application period exceeds 30 minutes, cracks occur within the piezoelectric single crystal device during the application period, or immediately following the end of the application period.

It is thought that overpolarization occurs under the above-described conditions, thereby deteriorating the piezoelectric properties of the piezoelectric single crystal device. Furthermore, the reason why cracks occur on the piezoelectric single crystal device is that distortion within the crystal 11 increases due to the excessive electric field, leading to breaking.

In either case with the crystal 10, with 0.91 lead zinc niobate (PZN)+0.09 lead titanate (PT), the electromechanical coupling factor $k_{31}$ in the direction orthogonal to the polarization direction (lateral vibration mode) exhibit 55% or less, and accordingly improvement under the polarization processing conditions cannot be obtained.

Moreover, in the case where a DC electric field of 400 V/mm is applied to the crystal 11 suitable for the lateral mode usage in silicon oil in the temperature 200° C. higher than the Curie temperature Tc shown in FIG. 4 for 120 minutes, and the temperature of the silicon oil is lowered down to the room temperature (25° C.) while maintaining the DC electric field, as shown in Example (10) in Table 3, the resulting electromechanical coupling factor $k_{31}$ in the direction orthogonal to the polarization direction (lateral vibration mode) is 80%, i.e., 70% or more, with 0.91 lead zinc niobate (PZN)+0.09 lead titanate (PT). Accordingly, a method that consists in cooling while applying an electric field (electric field cooling) is effective. However, in the crystal 10 under the above-described conditions, the resulting electromechanical coupling factor $k_{31}$ in the direction orthogonal to the polarization direction (lateral vibration mode) is 55% or less, and accordingly improvement cannot be obtained from electric field cooling under these polarization processing conditions.

Examples (2) through (8) in table 3 are cases where the piezoelectric single crystal device is fabricated under the polarization conditions where a DC electric field of 350 to 1500 V/mm is applied to the crystal for 30 to 180 minutes in a temperature range of 25 to 60° C. In this case, with 0.91 lead zinc niobate (PZN)+0.09 lead titanate (PT), the resulting electromechanical coupling factor $k_{31}$ in the direction orthogonal to the polarization direction (lateral vibration mode) of the crystal 11 suitable for the lateral vibration mode use is 78 to 86%, i.e., 70% or more in either case. However, with the crystal 10 under the above-described conditions, with 0.91 lead zinc niobate (PZN)+0.09 lead titanate (PT), the resulting electromechanical coupling factor $k_{31}$ in the direction orthogonal to the polarization direction (lateral vibration mode) is 55% or less, and accordingly improvement under these polarization processing conditions cannot be obtained.

Also, with regard to two cases where the molar fraction x of the lead zinc niobate (PZN) of x lead zinc niobate (PZN)+(1−x) lead titanate (PT)(PZN-PT) is 0.80 and 0.95 (0.80 PIMN-0.20 PT and 0.95 PZN-0.05 PT) and with regard to materials other than lead zinc niobate, i.e., lead magnesium niobate (PMN)+lead titanate (PT)(PMN-PT), and lead indium magnesium niobate (PIMN)+lead titanate (PT)(PIMN-PT), the devices were fabricated with the same fabrication method as that of 0.91 PZN-0.09 PT, and the electromechanical coupling factor k31 studied under the same testing conditions as with 0.91 PZN-0.09 PT. As a result, great electromechanical coupling factors $k_{31}$ were obtained in each material in an angle range 0 to 50° and an angle range 40 to 50°, as shown in Table 2. Note that with 0.70 PMN-0.30 PT, the molar fraction x of lead magnesium niobate (PMN) is 0.70, and with 0.70 PIMN-0.30 PT, the molar fraction x of lead indium magnesium niobate (PIMN) is 0.70.

Fourth Embodiment

Next, the auxiliary polarization processing method suitable for fabricating a piezoelectric single crystal device preferable for the lateral vibration mode usage is described below in reference to a fourth embodiment.

The electromechanical coupling factor $k_{31}$ of the lateral vibration mode of the piezoelectric single crystal device 11' fabricated under various auxiliary polarization processing conditions is measured. The measured results are shown in Table 4. The fabrication method for the piezoelectric single crystal device 11, the device dimensions, and the testing conditions employed are the same as those in the first embodiment. Also, as for the composition of the piezoelectric single crystal device, a device having the same composition as that in the second embodiment is employed. A piezoelectric single crystal device material 13 mm in length, 4 mm in width, and 0.36 mm in thickness is cut out using a dicing saw such that the angle made up of the normal direction 1 of the device edge face 11c and the direction n orthogonal to the domain structure (the direction in which the stripes extend) within the {100} face is 15°.

A Cr—Au coating film (a first layer formed of a Cr layer with a thickness of around 50 Å and a second layer formed of an Au layer with thickness of around 100 to 200 Å) is formed on both edge faces 11c of the crystal 11 suitable for the lateral vibration mode fabricated in the same way as with the first embodiment by sputtering, electrode fabrication is performed, and then the auxiliary polarization processing is performed under the conditions where the auxiliary polarization processing temperature is 25 to 40° C., the DC electric field applied is 320 to 1700 V/mm, and the application period is 10 to 150 minutes.

Subsequently, the electrode is completely dissolved and removed using a chemical etching solution and acid, and a Cr—Au coating film (the first layer formed of a Cr layer with thickness of around 50 Å and the second layer formed of an Au layer with thickness of around 100 to 200 Å) is formed on the opposing upper face 11a and lower face 11b of the {100} face of the piezoelectric single crystal device material 11 by sputtering, electrode fabrication is performed, and in the primary polarization processing a DC electric field of 700 V/mm is applied in an atmosphere of 25° C. for 60 minutes. The electromechanical coupling factor $k_{31}$ in the direction orthogonal to the polarization direction (lateral vibration mode) is shown in Table 4. Examples (2) through (6) in Table 4 are cases where the piezoelectric single crystal device is fabricated under the auxiliary polarization processing conditions where a DC electric field of 350 to 1500 V/mm is applied in a temperature range of 25 to 60° C. over a range of 10 to 120 minutes. In this case, with 0.91 lead zinc niobate (PZN)+0.09 lead titanate (PT), the electromechanical coupling factor $k_{31}$ in the direction orthogonal to the polarization direction (lateral vibration mode) of the crystal 11 preferable for the lateral vibration mode usage exhibited 78% or more in each material, while the $k_{31}$ in the untreated Example (11) in Table 4 in which the auxiliary polarization processing is not performed exhibits 74%. A greater electromechanical coupling factor $k_{31}$ is obtained due to this auxiliary polarization processing. With Example (8), in which the auxiliary polarization processing is performed under the same conditions as those in the above Example (3) following the primary polarization step, a large electromechanical coupling factor $k_{31}$ of 83% is also obtained.

Moreover, with the Examples (9) and (10), in which a bipolar triangular wave pulse electric field as shown in FIG. 10 is applied for 10 minutes prior to and following the primary polarization step, large electromechanical coupling factors $k_{31}$ are also obtained.

Also, with regard to the two cases where the molar fraction x of the lead zinc niobate (PZN) of x lead zinc niobate (PZN)+(1−X) lead titanate (PT)(PZN-PT) is 0.80 and 0.95 (0.80 PIMN-0.20 PT and 0.95 PZN-0.05 PT) and with regard to materials other than lead zinc niobate, i.e., lead magnesium niobate (PMN)+lead titanate (PT)(PMN-PT), and lead indium-magnesium niobate (PIMN)+lead titanate (PT)(PIMN-PT), the devices are fabricated with the same fabrication method as that of 0.91 PZN-0.09 PT, and the electromechanical coupling factor $k_{31}$ studied under the same testing conditions as those of 0.91 PZN-0.09 PT. As a result, as shown in Table 4, with the crystal 11 suitable for the lateral vibration mode usage, electric field application processing using a DC electric field of 350 to 1500 V/mm or a bipolar triangular wave pulse electric field in a temperature range 25 to 40° C, which are the auxiliary polarization processing conditions performed prior to or following the primary polarization processing, improved the electromechanical coupling factor $k_{31}$ As described above, with the devices of compositions other than 0.91 PZN-0.09 PT, the same results as with 0.91 lead zinc niobate (PZN)+0.09 lead titanate (PT) were obtained in each device. It should be noted that, with 0.70 PMN-0.30 PT, the molar fraction x of lead magnesium niobate (PMN) is 0.70, and with 0.70 PIMN-0.30 PT, the molar fraction x of lead indium-magnesium niobate (PIMN) is 0.70.

TABLE 1

| | ANGLE (deg.) BETWEEN DIRECTION n ORTHOGONAL TO DOMAIN STRUCTURE AND NORMAL DIRECTION 1 OF DEVICE | $K_{31}$ (%) | | MECHANICAL QUALITY FACTOR Qm | SPECIFIC INDUCTIVE CAPACITY εr | |
|---|---|---|---|---|---|---|
| | EDGE FACE | 90° | 0° | 0° | 0° | REMARKS |
| 0.91PZN – 0.09PT | ADDITIONAL ELEMENTS: 0 mass % | 50.7% | 86.2% | 65.0 | 3500 | PRESENT INVENTION |
| | Mn: 0.5 ppm | 50.1% | 79.0% | 120.0 | 3200 | PRESENT INVENTION |
| | Mn: 5 mass % | 49.0% | 76.0% | 150.0 | 3100 | PRESENT INVENTION |
| | Cr: 2 mass % | 48.3% | 79.6% | 120.0 | 3210 | PRESENT INVENTION |
| | Sb: 2 mass % | 50.1% | 81.0% | 75.0 | 4500 | PRESENT INVENTION |
| | Ca: 2 mass % | 50.0% | 80.2% | 73.5 | 3500 | PRESENT INVENTION |

TABLE 1-continued

| ANGLE (deg.) BETWEEN DIRECTION n ORTHOGONAL TO DOMAIN STRUCTURE AND NORMAL DIRECTION 1 OF DEVICE EDGE FACE | $K_{31}$ (%) 90° | $K_{31}$ (%) 0° | MECHANICAL QUALITY FACTOR Qm 0° | SPECIFIC INDUCTIVE CAPACITY $\epsilon r$ 0° | REMARKS |
|---|---|---|---|---|---|
| W: 2 mass % | 49.8% | 78.3% | 68.4 | 4300 | PRESENT INVENTION |
| Al: 2 mass % | 49.3% | 78.6% | 69.1 | 3800 | PRESENT INVENTION |
| La: 2 mass % | 45.0% | 76.5% | 67.0 | 4600 | PRESENT INVENTION |
| Li: 2 mass % | 50.2% | 79.6% | 66.0 | 3700 | PRESENT INVENTION |
| Ta: 2 mass % | 50.6% | 78.9% | 67.4 | 4700 | PRESENT INVENTION |
| Mn + Cr: 2 mass % | 50.2% | 80.0% | 170.0 | 3200 | PRESENT INVENTION |

TABLE 2

| ANGLE (deg.) BETWEEN DIRECTION n ORTHOGONAL TO DOMAIN STRUCTURE AND NORMAL DIRECTION 1 OF DEVICE EDGE FACE | $K_{31}$ (%) | | | | | REMARKS |
|---|---|---|---|---|---|---|
| | 0.91PZN – 0.09PT | 0.80PZN – 0.20PT | 0.95PZN – 0.05PT | 0.70PMN – 0.30PT | 0.70PIMN – 0.30PT | |
| 0 | 86.2 | 80.1 | 81.6 | 62.7 | 68.1 | PRESENT INVENTION |
| 5 | 82.1 | 79.3 | 76.4 | 60.3 | 62.3 | PRESENT INVENTION |
| 10 | 82.1 | 76.5 | 75.3 | 58.3 | 57.6 | PRESENT INVENTION |
| 15 | 74.2 | 71.3 | 72.1 | 53.0 | 54.6 | PRESENT INVENTION |
| 20 | 61.4 | 61.5 | 61.0 | 49.3 | 50.3 | COMPARATIVE EXAMPLE |
| 25 | 48.7 | 47.6 | 45.3 | 44.5 | 45.3 | COMPARATIVE EXAMPLE |
| 30 | 51.5 | 50.3 | 47.8 | 42.6 | 42.7 | COMPARATIVE EXAMPLE |
| 35 | 53.6 | 53.4 | 50.3 | 46.8 | 45.3 | COMPARATIVE EXAMPLE |
| 40 | 78.4 | 76.3 | 65.3 | 53.7 | 56.8 | PRESENT INVENTION |
| 45 | 86.3 | 80.4 | 79.6 | 61.8 | 66.8 | PRESENT INVENTION |
| 50 | 77.1 | 76.2 | 78.3 | 59.6 | 58.3 | PRESENT INVENTION |
| 55 | 63.7 | 61.4 | 60.7 | 57.1 | 54.1 | COMPARATIVE EXAMPLE |
| 60 | 60.3 | 59.3 | 56.3 | 51.7 | 51.6 | COMPARATIVE EXAMPLE |
| 65 | 57.5 | 55.6 | 52.1 | 47.5 | 46.2 | COMPARATIVE EXAMPLE |
| 70 | 55.2 | 51.3 | 49.6 | 46.2 | 45.3 | COMPARATIVE EXAMPLE |
| 75 | 56.7 | 50.3 | 47.3 | 44.3 | 43.1 | COMPARATIVE EXAMPLE |
| 80 | 53.7 | 49.6 | 46.2 | 42.7 | 43.1 | COMPARATIVE EXAMPLE |
| 85 | 51.2 | 48.3 | 46.3 | 41.8 | 42.6 | COMPARATIVE EXAMPLE |
| 90 | 50.7 | 47.1 | 45.3 | 41.3 | 42.4 | COMPARATIVE EXAMPLE |

TABLE 3

| | POLARIZATION CONDITIONS | | | PIEZOELECTRIC SINGLE CRYSTAL DEVICE 10' | | | | |
| --- | --- | --- | --- | --- | --- | --- | --- | --- |
| | | ELECTRIC | | $K_{31}$ (%) | | | | |
| No. | TEMPERATURE ° C. | FIELD V/mms | TIME min | 0.91PZN – 0.09PT | 0.80PZN – 0.20PT | 0.95PZN – 0.05PT | 0.70PMN – 0.30PT | 0.70PIMN – 0.30PT |
| (1) | 25 | 320 | 180 | 46 | 43 | 42 | 40 | 45 |
| (2) | 25 | 350 | 180 | 49 | 42 | 40 | 39 | 43 |
| (3) | 60 | 400 | 180 | 53 | 48 | 43 | 36 | 41 |
| (4) | 25 | 700 | 100 | 55 | 51 | 46 | 33 | 43 |
| (5) | 25 | 700 | 60 | 51 | 49 | 42 | 37 | 40 |
| (6) | 40 | 900 | 70 | 52 | 46 | 45 | 35 | 41 |
| (7) | 30 | 1200 | 60 | 54 | 53 | 48 | 37 | 43 |
| (8) | 40 | 1500 | 30 | 48 | 50 | 46 | 40 | 46 |
| (9) | 40 | 1700 | 30 | 45 | 43 | 40 | 38 | 42 |
| (10) | 200→25 ELECTRIC FIELD COOLING | 400 | 120 | 50 | 51 | 49 | 41 | 40 |

| | PIEZOELECTRIC SINGLE CRYSTAL DEVICE 11' | | | | | |
| --- | --- | --- | --- | --- | --- | --- |
| | $K_{31}$ (%) | | | | | |
| No. | 0.91PZN – 0.09PT | 0.80PZN – 0.20PT | 0.95PZN – 0.05PT | 0.70PMN – 0.30PT | 0.70PIMN – 0.30PT | REMARKS |
| (1) | 58 | 51 | 43 | 35 | 35 | COMPARATIVE EXAMPLE |
| (2) | 79 | 78 | 79 | 63 | 61 | EXAMPLE OF INVENTION |
| (3) | 78 | 76 | 78 | 61 | 63 | EXAMPLE OF INVENTION |
| (4) | 84 | 82 | 82 | 62 | 61 | EXAMPLE OF INVENTION |
| (5) | 86 | 81 | 80 | 61 | 62 | EXAMPLE OF INVENTION |
| (6) | 82 | 80 | 79 | 60 | 61 | EXAMPLE OF INVENTION |
| (7) | 84 | 83 | 80 | 62 | 62 | EXAMPLE OF INVENTION |
| (8) | 78 | 76 | 75 | 63 | 61 | EXAMPLE OF INVENTION |
| (9) | 53 | 49 | 48 | 40 | 42 | COMPARATIVE EXAMPLE |
| (10) | 80 | 79 | 78 | 61 | 60 | EXAMPLE OF INVENTION |

TABLE 4

| | AUXILIARY POLARIZATION CONDITIONS | | | | |
| --- | --- | --- | --- | --- | --- |
| No. | TEMPERATURE ° C. | TYPE OF ELECTRIC FIELD | ELECTRIC FIELD V/mm | TIME min | TIMING OF AUXILIARY POLARIZATION |
| (1) | 25 | DIRECT CURRENT | 320 | 150 | PRE-PROCESSING |
| (2) | 40 | DIRECT CURRENT | 350 | 120 | PRE-PROCESSING |
| (3) | 25 | DIRECT CURRENT | 700 | 100 | PRE-PROCESSING |
| (4) | 40 | DIRECT CURRENT | 900 | 70 | PRE-PROCESSING |
| (5) | 30 | DIRECT CURRENT | 1200 | 60 | PRE-PROCESSING |
| (6) | 40 | DIRECT CURRENT | 1500 | 10 | PRE-PROCESSING |
| (7) | 40 | DIRECT CURRENT | 1700 | 30 | PRE-PROCESSING |
| (8) | 25 | DIRECT CURRENT | 700 | 100 | POST-PROCESSING |
| (9) | 25 | BIPOLAR TRIANGULAR WAVE PULSE | PEAK VALUE 500 V/mm, INTERVAL 800 msec, | 10 min | PRE-PROCESSING |
| (10) | 25 | | | | POST-PROCESSING |
| (11) | | UNPROCESSED | | | |

TABLE 4-continued

PIEZOELECTRIC SINGLE CRYSTAL DEVICE 11'
$K_{31}$ (%)

| No. | 0.91PZN – 0.09PT | 0.80PZN – 0.20PT | 0.95PZN – 0.05PT | 0.70PMN – 0.30PT | 0.70PIMN – 0.30PT | REMARKS |
|---|---|---|---|---|---|---|
| (1) | 73 | 65 | 68 | 43 | 46 | COMPARATIVE EXAMPLE |
| (2) | 78 | 79 | 78 | 65 | 66 | EXAMPLE OF INVENTION |
| (3) | 83 | 78 | 76 | 73 | 75 | EXAMPLE OF INVENTION |
| (4) | 85 | 81 | 79 | 76 | 76 | EXAMPLE OF INVENTION |
| (5) | 83 | 80 | 81 | 74 | 75 | EXAMPLE OF INVENTION |
| (6) | 80 | 81 | 80 | 76 | 78 | EXAMPLE OF INVENTION |
| (7) | 71 | 61 | 63 | 43 | 46 | COMPARATIVE EXAMPLE |
| (8) | 83 | 83 | 82 | 79 | 78 | EXAMPLE OF INVENTION |
| (9) | 81 | 80 | 81 | 69 | 72 | EXAMPLE OF INVENTION |
| (10) | 79 | 79 | 79 | 68 | 70 | EXAMPLE OF INVENTION |
| (11) | 74 | 71 | 72 | 53 | 52 | EXAMPLE OF INVENTION |

What is claimed is:

1. A piezoelectric single crystal device which, with the polarization direction as a [001] axis of a pseudocubic system, that has an electromechanical coupling factor $k_{31}$ in the vibration mode of the lateral direction wherein:
   a normal direction of the piezoelectric device edge face is orthogonal to the polarization direction; and
   an angle between the normal direction of the piezoelectric device edge face and a direction orthogonal to a domain structure within a crystal face including [010] and [100] axes orthogonal to the polarization direction, is within a range of one of at least 0 to 15 degrees and 40 to 50 degrees.

2. The piezoelectric single crystal device according to claim 1, wherein said piezoelectric single crystal device comprises as the piezoelectric single crystal material, a solid solution comprising:
   x·Pb($A_1, A_2, \ldots, B_1, B_2, \ldots$)$O_3$+(1–x) $PbTiO_3$, wherein:
   x is a molar fraction, and 0<x<1;
   $A_1, A_2, \ldots$ are one or a plurality of elements selected from a group consisting of Zn, Mg, Ni, Lu, In and Sc;
   $B_1, B_2, \ldots$ are one or a plurality of elements selected from a group consisting of Nb, Ta, Mo and W; and
   the material has a complex perovskite structure.

3. The piezoelectric single crystal device according to claim 2, further comprising 0.5 ppm to 5 percent by mass of one or more elements selected from a group consisting of Mn, Cr, Sb, Ca, W, Al, La, Li and Ta.

4. A method of fabricating the piezoelectric single crystal device according to claim 1, said method comprising the steps of:
   cutting out a predetermined shape of a single crystal device material in a predetermined direction from a single crystal ingot having a domain structure; and
   applying an electric field to the [001] direction of said single crystal device material under predetermined conditions so as to polarize said single crystal device material.

5. The method of fabricating the piezoelectric single crystal device according to claim 4, wherein said applying step applies a DC electric field of 350 to 1500 V/mm in a temperature range of 20 to 200 degrees C. to the [001] direction of said cut out single crystal device material.

6. The method for fabricating the piezoelectric single crystal device according to claim 4, wherein said applying step applies a DC electric field of 250 to 500 V/mm in the [001] direction of said cut out single crystal device material at a temperature higher than the Curie temperature (Tc) of the single crystal device material, and cooling the temperature to room temperature while maintaining the application of the DC electric field.

7. The method for manufacturing the piezoelectric single crystal device according to claim 4, said method further comprising applying an electric field in a direction orthogonal to the polarization direction so as to polarize said single crystal device material following or prior to applying the electric field to the [001] direction.

8. A method of fabricating the piezoelectric single crystal device according to claim 2, said method comprising the steps of:
   cutting out a predetermined shape of a single crystal device material in a predetermined direction from a single crystal ingot having a domain structure; and
   applying an electric field to the [001] direction of said single crystal device material under predetermined conditions so as to polarize said single crystal device material.

9. A method of fabricating the piezoelectric single crystal device according to claim 3, said method comprising the steps of:
   cutting out a predetermined shape of a single crystal device material in a predetermined direction from a single crystal ingot having a domain structure; and
   applying an electric field to the [001] direction of said single crystal device material under predetermined con ditions so as to polarize said single crystal device material.

10. The method for manufacturing the piezoelectric single crystal device according to claim 5, said method further comprising applying an electric field in a direction orthogonal to the polarization direction so as to polarize said single crystal device material following or prior to applying the electric field to the [001] direction.

11. The method for manufacturing the piezoelectric single crystal device according to claim 6, said method further comprising applying an electric field in a direction orthogonal to the polarization direction so as to polarize said single crystal device material following or prior to applying the electric field to the [001] direction.

* * * * *

UNITED STATES PATENT AND TRADEMARK OFFICE
CERTIFICATE OF CORRECTION

PATENT NO. : 7,015,628 B2
APPLICATION NO. : 10/846681
DATED : March 21, 2006
INVENTOR(S) : Mitsuyoshi Matsushita and Yousuke Iwasaki It is certified that error appears in the above-identified patent and that said Letters Patent is hereby corrected as shown below:

<u>Column 9</u>
Line 66, replace "50 Å" with --50 nm--.
Line 67, replace "100 to 200 Å" with --100 to 200 nm--.

<u>Column 12</u>
Line 56, replace "50 Å" with --50 nm--.
Line 57, replace "100 to 200 Å" with --100 to 200 nm--.

<u>Column 17</u>
Line 18, replace "50 Å" with --50 nm--.
Line 19, replace "100 to 200 Å" with --100 to 200 nm--.
Line 31, replace "50 Å" with --50 nm--.
Line 32, replace "100 to 200 Å" with --100 to 200 nm--.

Signed and Sealed this

Twenty-sixth Day of December, 2006

JON W. DUDAS
*Director of the United States Patent and Trademark Office*